United States Patent
Laursen et al.

(10) Patent No.: US 10,963,405 B2
(45) Date of Patent: Mar. 30, 2021

(54) MINIMUM INPUT/OUTPUT TOGGLING RATE FOR INTERFACES

(71) Applicant: Intel Corporation, Santa Clara, CA (US)

(72) Inventors: Soren Laursen, Alleroed (DK); Robert Critchlow, Bucks (GB); Zefu Dai, York (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/369,411

(22) Filed: Mar. 29, 2019

(65) Prior Publication Data

US 2020/0310998 A1 Oct. 1, 2020

(51) Int. Cl.
*G06F 13/20* (2006.01)
*G11C 7/10* (2006.01)
*G06F 7/58* (2006.01)

(52) U.S. Cl.
CPC .............. *G06F 13/20* (2013.01); *G06F 7/582* (2013.01); *G11C 7/1006* (2013.01); *G06F 2213/40* (2013.01)

(58) Field of Classification Search
None
See application file for complete search history.

(56) References Cited

U.S. PATENT DOCUMENTS

2003/0125015 A1* 7/2003 Inoue ................. H04L 9/00 455/411
2004/0153850 A1* 8/2004 Schoenborn ....... H04L 41/0659 714/43
2008/0019451 A1 1/2008 Jang et al.
2009/0179782 A1 7/2009 Hollis
2010/0057971 A1* 3/2010 Kao ..................... G06F 13/4072 710/305

(Continued)

FOREIGN PATENT DOCUMENTS

KR 20040012677 2/2004
KR 20130045257 5/2013

OTHER PUBLICATIONS

International Search Report & Written Opinion dated Jun. 2, 2020 for PCT Patent Application No. PCT/US2020/017281.

*Primary Examiner* — Farley Abad
*Assistant Examiner* — Dayton Lewis-Taylor
(74) *Attorney, Agent, or Firm* — Green, Howard & Mughal LLP

(57) ABSTRACT

An apparatus for implementing a minimum toggle rate guarantee may comprise first, second, and third circuitries. The first circuitry may calculate a sequence of values for an internal bus inversion signal based upon a sequence of values for a plurality of internal Input/Output (IO) signals. The second circuitry may establish a sequence of values for an external bus inversion signal by selecting between the sequence of values for the internal bus inversion signal and a sequence of substantially random values. The third circuitry may set the values for a plurality of external IO signals to inverted values of the plurality of internal signals when respectively corresponding sequence of values for the external bus inversion signal have a first value, and to values of the plurality of internal signals when respectively corresponding sequence of values for the external bus inversion signal have a second value.

20 Claims, 9 Drawing Sheets

(56) References Cited

U.S. PATENT DOCUMENTS

2010/0309964 A1* 12/2010 Oh ................. G06F 13/4243
375/219
2012/0206280 A1* 8/2012 Abbasfar ........... G06F 13/4072
341/51

* cited by examiner

MINIMUM INPUT/OUTPUT TOGGLING RATE FOR INTERFACES

BACKGROUND

Modern chip-to-chip parallel interfaces may comprise relatively wide Input/Output (IO) buses with clock frequencies over 1 gigahertz (GHz). Wide IO busses may raise various Signal Integrity (SI) issues, such as effects related to Simultaneous Switching Noise (SSN). When multiple IO output drivers switch simultaneously, they may induce a voltage drop in a chip power distribution, or package power distribution, and may momentarily raise a ground voltage within the device relative to a system ground. SSN may be related to an inductance that may be present between the device ground and the system ground, a Simultaneous Switching Output (SSO) count of the interface, and a slew rate of output drivers, for example.

A feature of chip-to-chip interfaces that may reduce SSN is a Bus Inversion (BI) signal, which indicates whether data currently being transmitted on an interface is inverted or not. Using a BI signal, a choice may be made to send either non-inverted data or inverted data, depending on which would have a lower SSO count. One example implementation of BI logic may be to count a total number of bits in a covered bus having a first value (e.g., a value of "1"). If the total number is larger than half of a width of the covered bus, the BI bit may be set to a predetermined value (e.g., a value of "1") and inverted data may be sent on the interface. Doing so may facilitate keeping an SSO count on the covered bus continuously at or below half of the width of the covered bus, and may therefore bound a level of SSN corresponding with the covered bus.

For synchronous chip-to-chip interfaces, an associated clock IO signal may be constantly toggling, while other non-clock IO signals may toggle far less frequently. At high IO clock frequencies, a timing margin for interface IOs to act synchronously as a group may become so tight that once-negligible timing factors, like transistor aging, may become significant. Meanwhile, the use of BI signals may reduce a rate of IO toggling, which may impact various aspects of transistor aging, and may in turn impact timing margins for interface IOs.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
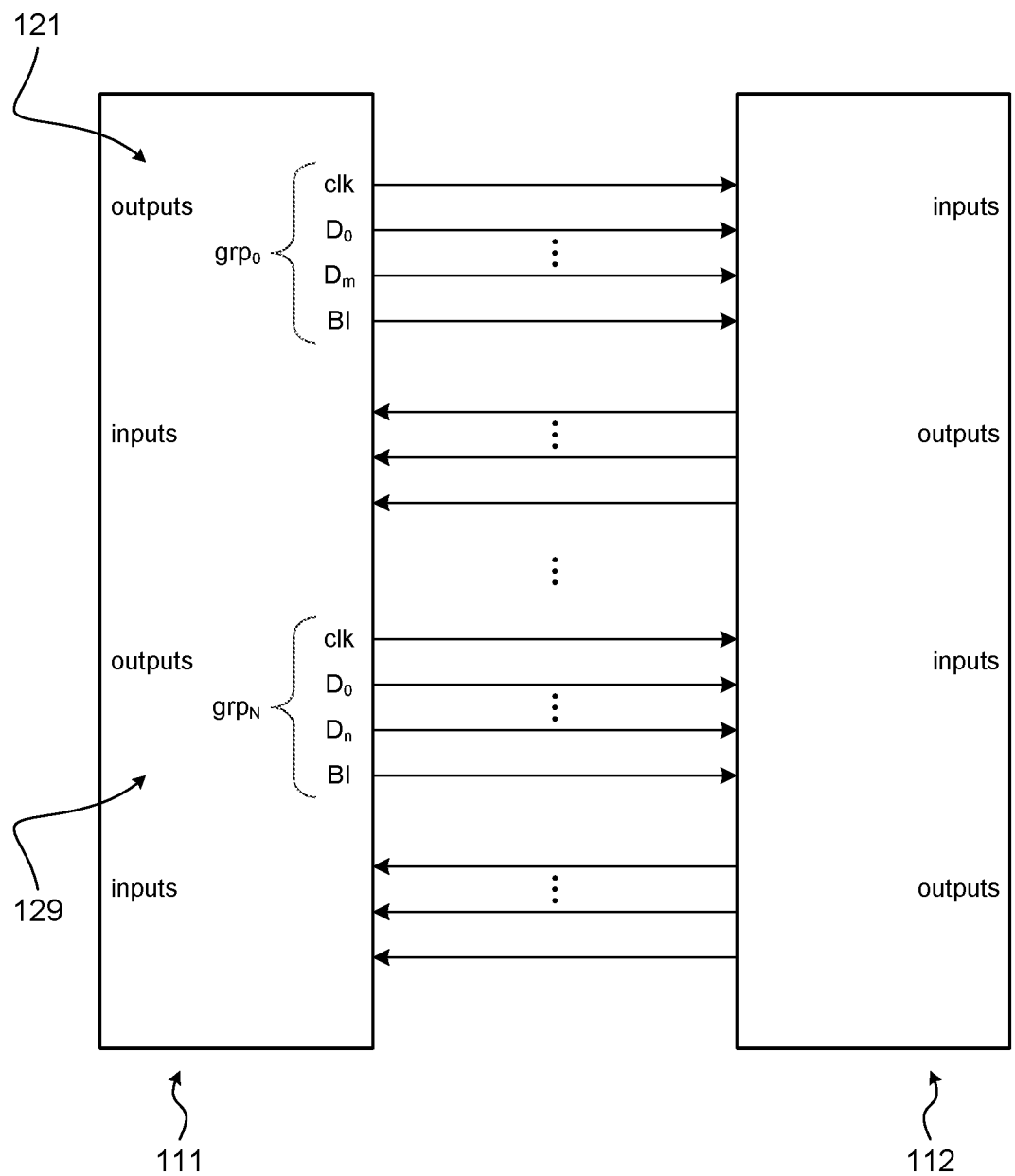
FIG. 1 illustrates a block diagram including synchronous chip-to-chip interfaces, in accordance with some embodiments of the disclosure.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Modern chip-to-chip parallel interfaces with relatively wide Input/Output (IO) buses may employ Bus Inversion (BI) signals (which may indicate whether data currently being transmitted on the interface is inverted or not) to reduce Simultaneous Switching Noise (SSN) effects. However, BI signals may reduce a rate of IO toggling. In turn, reduced toggle rates may impact various aspects of transistor aging, and may thereby impact timing margins for interface IOs. When individual IOs are impacted by different transistor aging factors, the timing margin of the entire interface may ultimately suffer due to aggregated aging effects.

Transistor aging may occur as Metal Oxide Semiconductor Field Effect Transistor (MOSFET) device characteristics degrade over time (usually over long periods of time measured by years). Device characteristic degradation may cause switching speeds to decrease and may eventually hasten the device's end-of-life. Transistor aging may happen to transistors both internally on the die and at IO buffers. Major causes for transistor aging may include Hot Carrier Injection (HCI), Bias Temperature Instability (BTI), and Time-Dependent Dioxide Breakdown (TDDB).

HCI is related to high-energy carriers flowing through a device channel and injecting themselves into a dielectric layer of a transistor. As a result of HCI, a threshold voltage may degrade gradually, which may lead to slower switching speeds over time. HCI effects cannot be recovered by reversing the state of the transistor.

BTI is a degradation phenomenon (most noticeable in p-channel MOSFETs) which may be occur with negative gate voltages at elevated temperatures. An associated electric field may fill some preexisting traps in the bulk of the dielectric with carriers from the channel. BTI degradation will be recovered over time (e.g., a few microseconds) when a stress voltage is removed.

TDDB is related to electric fields stochastically causing defects in a dielectric due to the electron tunneling effect. A permanent break down may occur when a conducting path between the gate and the substrate is formed.

Furthermore, IO aging delays may occur in different voltage-transition directions. For example, due to the BTI effect, some IOs may acquire a faster 0-to-1 transition time and a slower 1-to-0 transition time by staying at a high voltage level (e.g., a "1") for a long period. Alternatively, due to the HCI effect, some IOs may acquire a slower 0-to-1 transition time.

Disclosed herein are various mechanisms and methods for mitigating aging effects on timing margin, which may keep all the data IOs of a covered bus aging at substantially the same pace, and in substantially the same direction of voltage transitions, as the clock signal of the covered bus. This may be achieved by toggling the data IOs at or above a minimum toggle rate r (where $0<r<1$). For example, for a defined number of clock cycles C, all the data IOs would toggle at least a number of times $r*C$.

With a minimum toggle rate guarantee, the BTI effect may be minimized, and all IOs of a covered bus may age at a substantially synchronous pace. Simulations show that a small minimum toggle rate (e.g., 5%) may significantly reduce a timing margin loss caused by aging effects.

Although the use of a BI signal may exacerbate aging effects, a BI signal may advantageously be leveraged to guarantee a minimum toggle rate, by occasionally or periodically repurposing it for IO toggling instead of for reducing SSN. Using the BI signal, randomized toggling may be introduced on the data IOs regardless of the traffic pattern on the data IOs, and may thereby achieve a minimum toggle rate guarantee without any cost in data bandwidth at the interface.

Such designs may have various advantages. First, they might not require any logic to monitor toggle rates (e.g., of individual IOs), and may thus have low hardware overhead. Second, they might not depend on traffic patterns, and may have zero impact to user traffic (in other words, the existence of the minimum toggle rate logic may be transparent to users). Third, they might not consume any data bandwidth, and may thus can be used in any application scenario. Fourth, they may have low hardware implementation costs.

A minimum toggle rate guarantee may impact SSN reduction, since SSN may be higher for cycles in which the BI signal is repurposed for IO toggling. However, this impact may be mitigated in various ways. First, the guaranteed minimum toggle rate may be set to a smallest number desired to mitigate aging effects (e.g., 5%). Second, cycles in which the BI signal is being repurposed may be broken apart, which may keep SSN effects from building up. Third, for interfaces with multiple BI groups, different BI groups may have their BI signals repurposed at different cycles, so that the impact to SSN reduction may be limited to one BI group at a time.

The mechanisms and methods disclosed herein may comprise digital systems for toggling IO signals stochastically to establish a minimum toggle rate guarantee. The systems may leverage BI signals to apply a substantially randomly-modified or stochastically-modified BI bit stream to a bus covered by the BI signal (e.g., to a group of signals, which may include data signals), and as a result the systems may toggle those data IOs with a designed minimum toggle rate. The mechanisms and methods may advantageously have no impact to user traffic, and may advantageously be independent of user traffic patterns.

FIG. 1 illustrates a block diagram including synchronous chip-to-chip interfaces, in accordance with some embodiments of the disclosure. A system 100 comprises a first chip 111, a second chip 112, and at least a first chip-to-chip interface 121. In various embodiments, system 100 may also comprise one or more additional chip-to-chip interfaces, starting from a second chip-to-chip interface, and so on, through an Nth chip-to-chip interface 129.

First interface 121 through Nth interface 129 may include a clock signal, a plurality of covered bus signals (e.g., data signals), and a BI signal covering the plurality of bus signals. These may be outputs of first chip 111 and inputs to second chip 112. In system 100, there may also be a plurality of inputs to first chip 111 which are outputs of second chip 112 (which in some embodiments may be portions of, respectively, first interface 121 through Nth interface 129). In various embodiments, first interface 121 through Nth interface 129 may be synchronous interfaces.

The BI signals of first interface 121 through Nth interface 129 may indicate to the receiving device (e.g., second chip 112) whether transmissions on the covered bus signals (e.g., data) is inverted, or not inverted. When the corresponding BI signal has a predetermined value (e.g., has a value of "1"), the covered IO pins may be driven to inverted values, and when the corresponding BI signal does not have the predetermined value (e.g., has a value of "0"), the covered IO pins may be driven to non-inverted values (e.g., normal values).

Figure 2A:
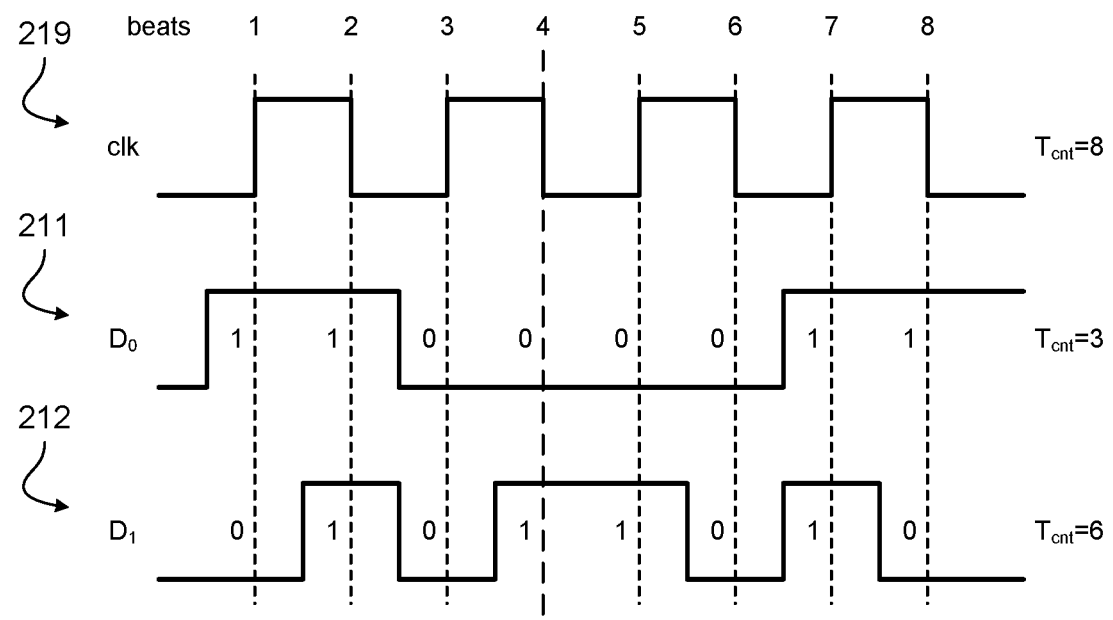
FIGS. 2A and 2B illustrate cycle-by-cycle waveforms of internal signals and external signals, respectively, of bus covered by a Bus Inversion (BI) signal, in accordance with some embodiments of the disclosure.
Figure 2B:
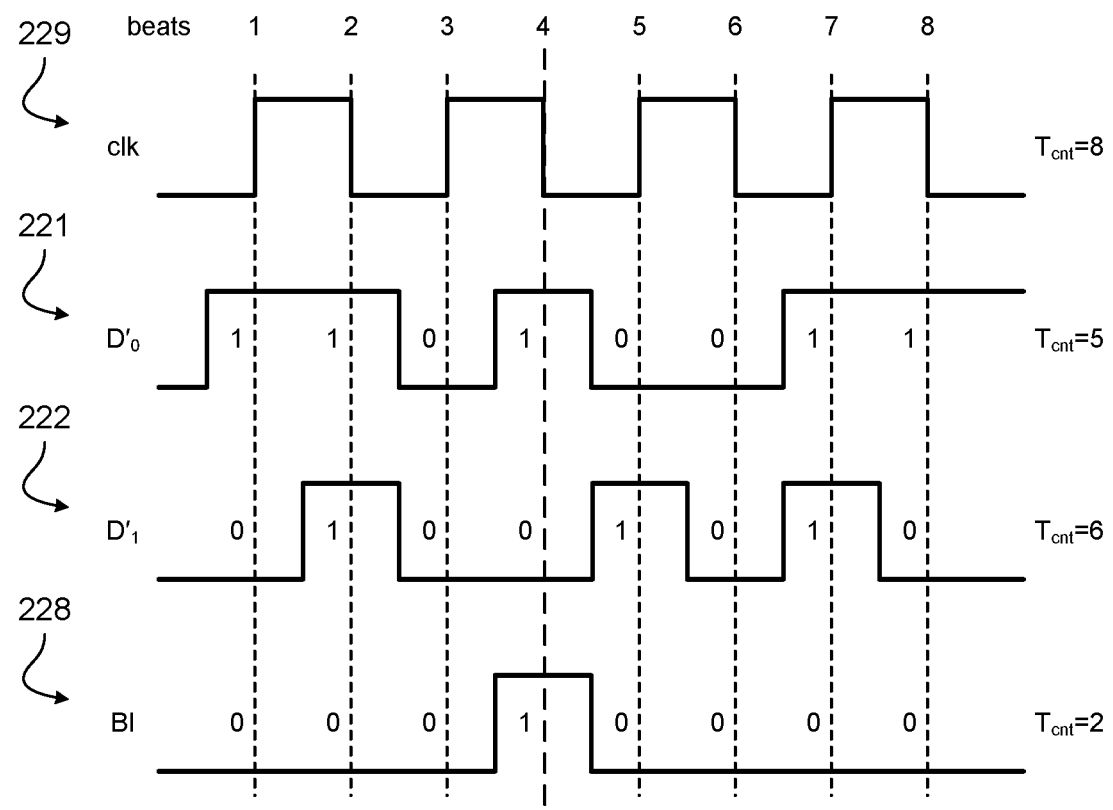

FIGS. 2A and 2B illustrate cycle-by-cycle waveforms of internal signals and external signals, respectively, of bus covered by a BI signal, in accordance with some embodiments of the disclosure. A covered bus may correspond with a set of internal signals D (which carry values prior to any potential inversion by a BI signal) and a set of external signals D' (which carry values subsequent to any potential inversion by a BI signal). The covered bus may send data at various "beats" relative to a corresponding clock signal. In some embodiments, there may be a single beat per clock cycle (e.g., a time between rising edges of the clock), while in other embodiments there may two beats per clock cycle (as with double data-rate signaling), or four beats per clock cycle (as with quad data-rate signaling). For example, FIGS. 2A and 2B depict clocks having two beats per clock cycle (e.g., double data-rate signaling).

On each beat, a value for a BI signal may be calculated according to a specific rule (e.g., whether a total number of 1's of the covered bus signals is larger than a total number of 0's of the covered bus signals). The BI signal may then be transmitted on the interface, together with the data, to the receiver.

The BI signal may have a first predetermined value (e.g., a value of "1") if to indicate that the covered bus signals are inverted, and may have a second predetermined value (e.g., a value of "0") to indicate that the covered bus signals are not inverted. (In various embodiments, the behavior of the internal signals may also correspond to the behavior of the corresponding external signals when a BI mode has not been enabled for the interface; accordingly, when the BI mode is disabled, values of internal signals may merely be driven without inversion onto the external signals.)

Accordingly, in FIG. 2A, internal signals 210 may comprise a first bus signal 211, a second bus signal 212, and a clock signal 219. Within the eight beats of the four clock cycles depicted, clock signal 219 may toggle eight times, first covered bus signal 211 may toggle 3 times, and second covered bus signal 212 may toggle 6 times. First bus signal 211 and second bus signal 212 are not yet covered by a BI signal.

In FIG. 2B, external signals 220 may comprise a first bus signal 221, a second bus signal 222, and a clock signal 229. Within the eight beats of the four clock cycles depicted, clock signal 229 may toggle eight times, as did clock signal 219 (of internal signals 210). However, in comparison with internal signals 210, first bus signal 221 and second bus signal 222 of external signals 220 are covered by a BI signal 228.

In a fourth depicted beat of FIG. 2B, BI signal 228 has a predetermined value (in this instance, a value of "1"). As a result, the values of first bus signal 211 and second bus signal 212 of internal signals 210 in that beat are inverted to become the values of first bus signal 221 and second bus signal 222 of external signals 220. After the application of BI signal 228, a toggle count of first bus signal 221 in the 8-beat duration changes from 3 to 5, while a toggle count of second bus signal 222 remains unchanged. (BI signal 228 itself has a toggle count of 2.) Accordingly, BI signal 228 may increase a toggle rate of the covered bus.

Figure 3:
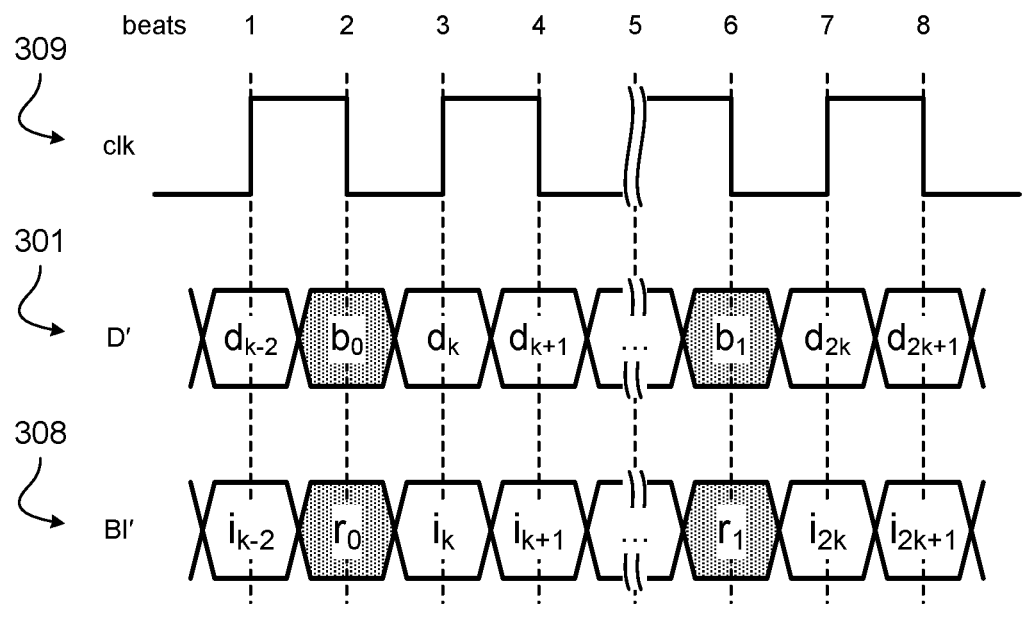
FIG. 3 illustrates cycle-by-cycle waveforms of external signals of a bus covered by a BI bit stream with a random bit value in every kth bit position, in accordance with some embodiments of the disclosure.

In a sequence of N data beats, consecutive BI bits may constitute an N-bit BI bit stream. FIG. 3 illustrates cycle-by-cycle waveforms of external signals of a bus covered by a BI bit stream with a random bit value in every kth bit position, in accordance with some embodiments of the disclosure. Waveforms 300 may comprise a clock signal 309 and one or more external bus signals 301 covered by a BI signal 308.

In various embodiments, to provide a minimum toggle rate guarantee, a subset of values of an N-bit BI bit stream may be replaced with random values (e.g., substantially randomly-determined values or substantially stochastically-determined values). For example, every kth bit of a BI bit stream may be substituted with a random bit value $r_i$ (where $0<=i<=N/k$).

For bit values $\{r_i | 0<=i<=N/k\}$ that are random, each bit value has an equal probability of being a "0" or a "1" (e.g., $P\{r_i=1\}=P\{r_i=0\}=0.5$). The BI bit stream may be considered as having a sub-stream $\{b_i | 0<=i<=N/k\}$ comprising every kth bit of the BI bit stream. Around half of the bits of sub-stream $b_i$ will have values that are inverted relative to the values they had before the substitution of the random bit values.

After a covered bus has been inverted (or not) in accordance with the modified BI bit stream, the covered bus will be inverted in some cases in which it would not have been inverted by the original BI bit stream, and will not be inverted in some cases in which it would have been inverted by the original BI bit stream. Assuming that in the sub-stream $\{b_i\}$ of the original BI bit stream, the number of 1's is different from the number of 0's (e.g., $C(b_i=1)=x$, $C(bi=0)=y$, and $x!=y$), then by applying the random BI stream $\{r_i\}$ to the sub-stream $\{b_i\}$ of the original BI bit stream, about half of the 1's will be inverted to 0's and half of the 0's will be inverted to 1's. As a result, if the length N of the BI bit stream is large enough, the final count of 1's and 0's in the bit stream $\{r_i \oplus b_i\}$ will converge toward x/2 and y/2, respectively (e.g., $P\{r_i \oplus bi=1\}=P\{ri \oplus bi=0\}=0.5$). Thus, applying random bits to the non-random sub-stream $\{b_i\}$ will turn the latter into a random bit stream.

Moreover, in terms of toggle rate, any random bit stream has an expected toggle rate of 50%. At any given time t, a random bit stream $\{r_i | 0<=i<=N\}$ has a value of $r_t$ (where $0<t<N-1$). In the next cycle, the probability of a new value at the subsequent time $r_t+1$ causing a toggle (e.g., $r_t+1 != r_t$) is 50%. As a result, the entire bit stream has an expected toggle rate of $E[Rate_{toggle}]=50\%$.

Since the sub-stream of the BI stream, as modified (e.g., $\{ri \oplus bi | 0<=i<=N/k\}$) has an expected toggle rate of the 50%, its expected toggle count is 50%*N/k=N/2 k. Therefore, the minimum toggle rate of the entire data bit stream is (N/2 k)/N=½ k=(½) k.

Accordingly, by substituting random bits into the BI bit stream at every kth bit position, all data pins covered by the BI signal (as well as the BI pin itself) will have an expected minimum toggle rate of (½) k. As time goes on, the actual minimum toggle rate may sufficiently converge toward the expected minimum toggle rate that the covered data pins will satisfy a minimum toggle rate guarantee. For example, when BI signal 308 has a random value for every kth bit of the BI bit stream, for sufficiently long periods of time, external bus signals 301 covered by BI signal 308 may have a guaranteed minimum toggle rate of (½) k.

Figure 4:
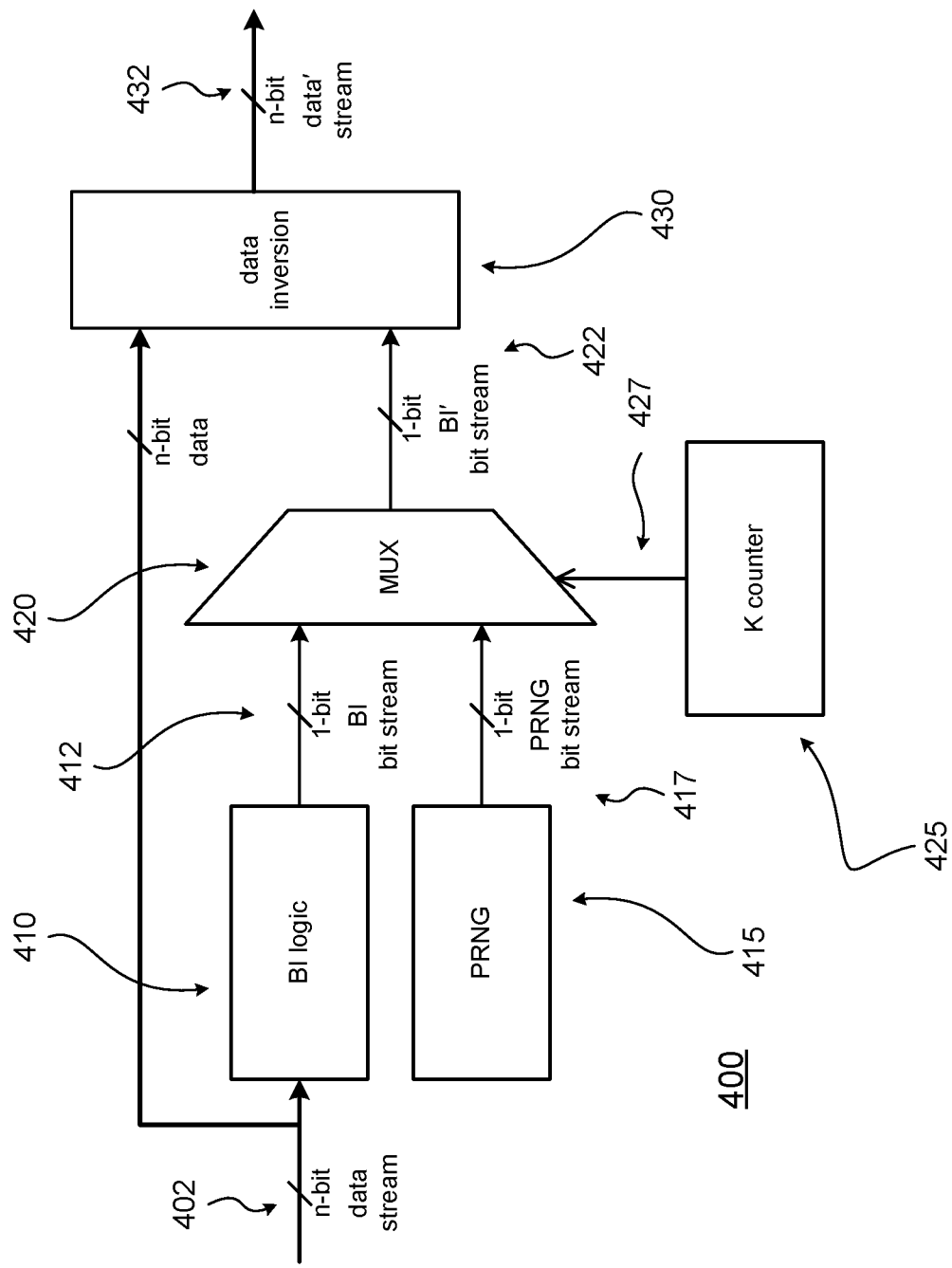
FIG. 4 illustrates a diagram of a BI circuitry implementing a minimum toggle rate guarantee, in accordance with some embodiments of the disclosure.

FIG. 4 illustrates a diagram of a BI circuitry implementing a minimum toggle rate guarantee, in accordance with some embodiments of the disclosure. A design 400 may comprise a first circuitry 410, a second circuitry 420, and a third circuitry 430. First circuitry 410 may calculate a value for an internal BI signal 412 based on values of a plurality of internal Input/Output (IO) signals 402 (which may be internal signals of a covered bus). Second circuitry 420 may determine a value for a BI signal 422 of an external interface, based on both the value of the internal BI signal 412 and a stochastic toggling component. Third circuitry 430 may set the values of a plurality of IO signals 432 of the external interface based on the values of the plurality of internal signals 402 and the value of BI signal 422 of the external interface.

In some embodiments, first circuitry 410 may calculate a sequence of values for internal BI signal 412 based upon a sequence of values for the plurality of internal Input/Output (IO) signals 402 (e.g., for SSN and/or SSO purposes). In various embodiments, the value for internal BI signal 412 may be deterministic, and may be calculated or otherwise determined for each beat of data on a bus. For some embodiments, internal BI signal 412 may be determined to reduce an SSO property of the plurality of IO signals 432. In some embodiments, internal BI signal 412 may be determined to reduce an SSN property of the plurality of IO signals 432.

For some embodiments, second circuitry 420 may establish a sequence of values for BI signal 422 by selecting between the sequence of values for internal BI signal 412 and a sequence of substantially random values 417. In various embodiments, second circuitry 420 may comprise a multiplexor selecting between internal BI signal 412 and the sequence of substantially random values 417. In some embodiments, the stochastic toggling component (which may be a part of sequence of substantially random values 417) may be generated by an additional circuitry 415. In some embodiments, additional circuitry 415 may be a Pseudo-Random Number Generator (PRNG) circuitry, which may generate a stream of pseudo-random bits.

In some embodiments, the stochastic toggling component may be generated to satisfy a predetermined minimum toggling rate for at least one of the plurality of IO signals 432. For some embodiments, second circuitry 420 may determine a value for BI signal 422 based at least in part upon an output of an additional circuitry 425. In some embodiments, additional circuitry 425 may be a counter circuitry, which may count to a value (e.g., a predetermined constant k), toggle a counter output 427, and then reset. As a result, second circuitry 420 may select between the sequence of values for internal BI signal 412 and a sequence of substantially random values 417 on every kth beat.

In some embodiments, third circuitry 430 may set the values for IO signals 432 to inverted values of internal signals 402 when respectively corresponding sequence of values for BI signal 422 have a first value, and to values of internal signals 402 when respectively corresponding sequence of values for BI signal 422 have a second value.

In various embodiments, the external interface may be a chip-to-chip communication interface. For some embodiments, the plurality of IO signals 432 may be clocked at a frequency of at least 1 GHz. In some embodiments, the plurality of IO signals 432 may comprise at least one of a data signal, and an address signal.

In various embodiments, internal signals 402 and external IO signals 432 may correspond with a number N of signal paths (e.g., wires), while internal BI signal 412, external BI signal 422, substantially random value 417, and counter output 427 may correspond with a single signal path. In various embodiments, streams of values may be transmitted on these signal paths (e.g. at a rate of one value per beat).

Figure 5A:
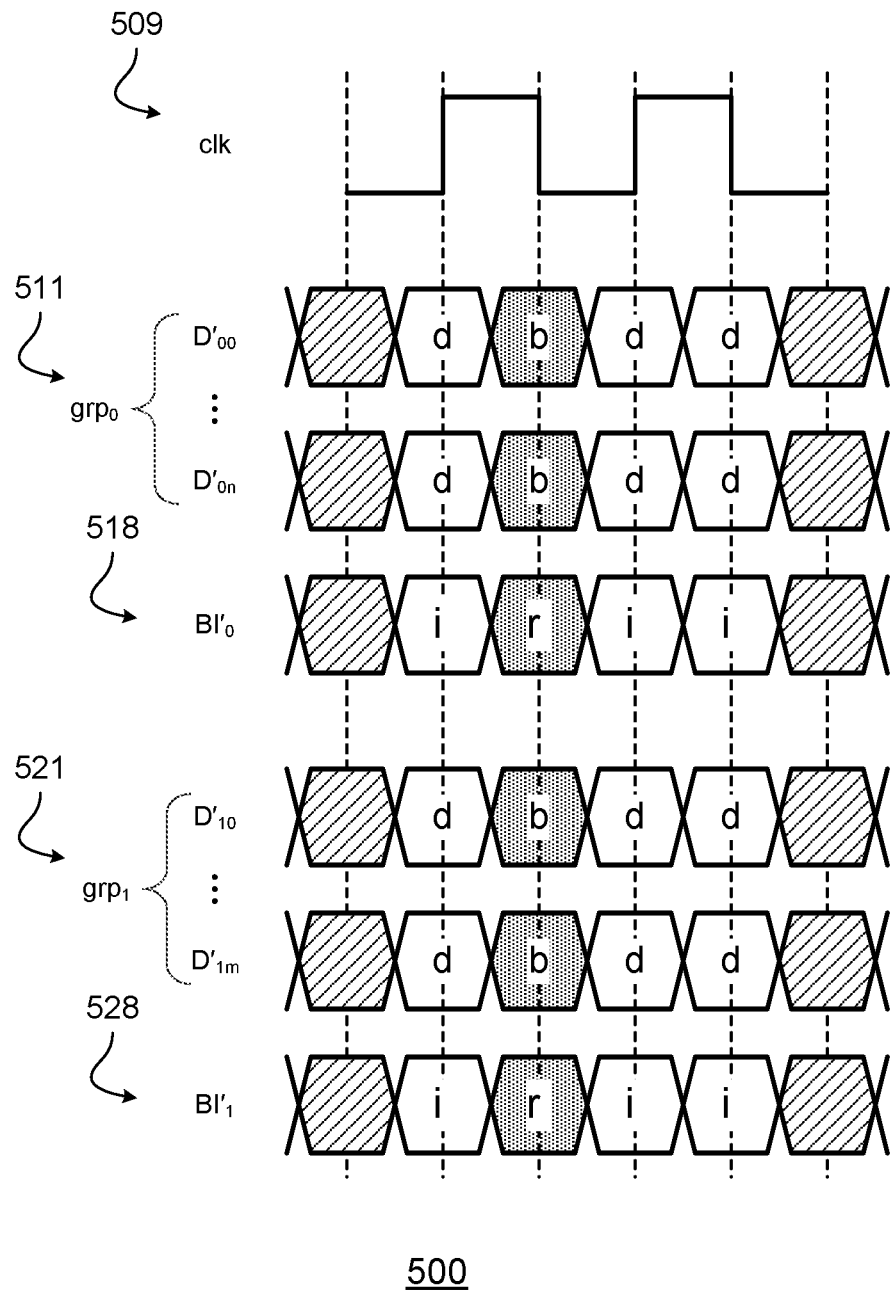
FIGS. 5A and 5B illustrate cycle-by-cycle waveforms of non-interleaved and interleaved external signals, respectively, of two buses covered by BI signals, in accordance with some embodiments of the disclosure.
Figure 5B:
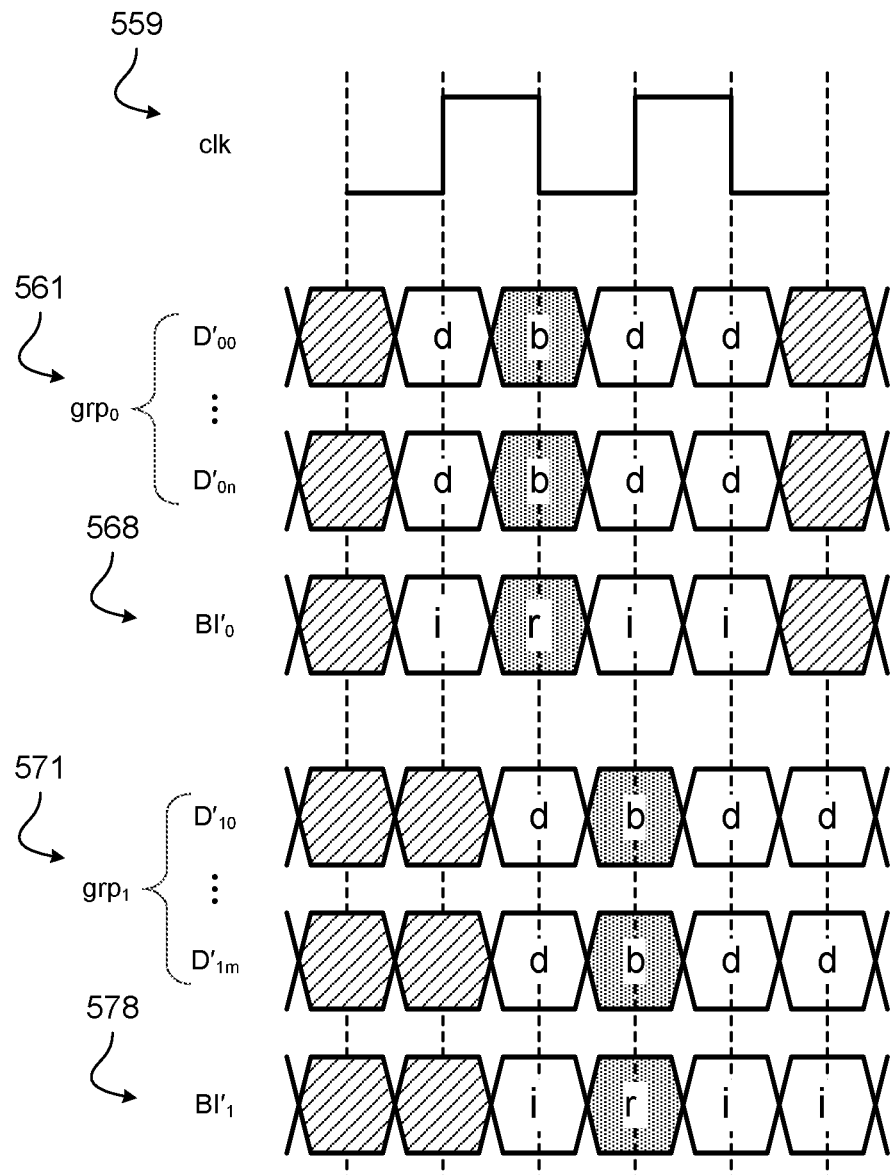

FIGS. 5A and 5B illustrate cycle-by-cycle waveforms of non-interleaved and interleaved external signals, respectively, of two buses covered by BI signals, in accordance with some embodiments of the disclosure. A first scenario 500 may comprise a first group of bus signals 511 covered by a first BI signal 518, a second group of bus signals 521 covered by a second BI signal 528, and a clock signal 509. A second scenario 550 may comprise a first group of bus signals 561 covered by a first BI signal 568, a second group of bus signals 571 covered by a second BI signal 578, and a clock signal 559.

In scenarios like first scenario 500, if all random bits in BI bit streams covering different groups of bus signals happen on the same cycle, there can be as much as 100% SSO in the worst case. For example, when the data bus is idling, all data bits may have a value of "0"; then, if all groups of bus signals covered by BI signals happen to have a randomly-established values of "1," the entire data bus may be toggled, resulting in the worst SSN.

For chip-to-chip interfaces having multiple groups of bus signals covered by BI signals, such impacts to SSN may be mitigated by interleaving (or staggering in time) the random BI bit positions for different groups of bus signals. So, in scenarios like second scenario 550, by interleaving the random bit position of different groups of bus signals covered by BI signals, there may only be a single group of data being toggled, in the worst case. As a result, the worst case SSN may be reduced to 1/g of the total number of data IOs in the interface (where g may be a number of groups of bus signals covered by BI signals).

In some embodiments, random bit position interleaving may be implemented by initializing different counter circuitries (such as additional circuitry 425) for different groups of bus signals with different initial values.

Figure 6:
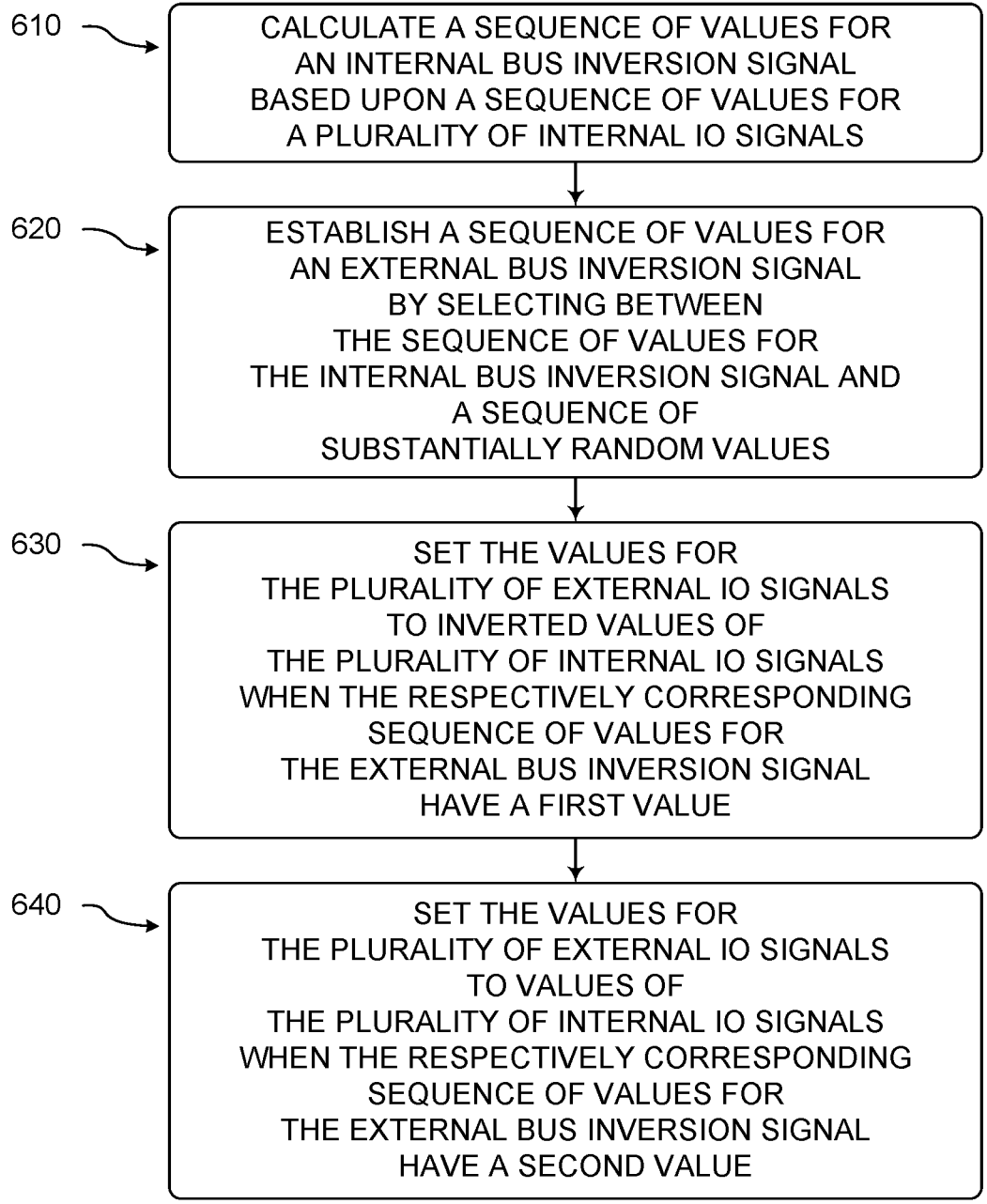
FIG. 6 illustrates methods for implementing a minimum toggle rate guarantee, in accordance with some embodiments of the disclosure.

FIG. 6 illustrates methods for implementing a minimum toggle rate guarantee, in accordance with some embodiments of the disclosure. In some embodiments, a method 600 may comprise a block 610, a block 620, a block 630, and a block 640.

In block 610, a sequence of values for an internal bus inversion signal may be calculated based upon a sequence of values for a plurality of internal signals. In block 620, a sequence of values for an external bus inversion signal may be established by selecting between the sequence of values for the internal bus inversion signal and a sequence of substantially random values.

In block 630, the values for a plurality of external IO signals may be set to inverted values of the plurality of internal signals when the respectively corresponding sequence of values for the external bus inversion signal have a first value. In block 640, the values for the plurality of external IO signals may be set to values of the plurality of internal signals when the respectively corresponding sequence of values for the external bus inversion signal have a second value.

In some embodiments, the sequence of substantially random values may be generated by a PRNG circuitry. For some embodiments, the selection for the sequence of values may be based additionally upon an output of a counter circuitry. In some embodiments, the sequence of substantially random values may satisfy a predetermined minimum toggling rate for at least one of the plurality of IO signals of the external interface. For some embodiments, the internal bus inversion signal may be determined to reduce at least one of an SSO property of the plurality of IO signals of the external interface, and an SSN property of the plurality of IO signals of the external interface.

Although the actions in the flowchart with reference to FIG. 6 are shown in a particular order, the order of the actions can be modified. Thus, the illustrated embodiments can be performed in a different order, and some actions may be performed in parallel. Some of the actions and/or operations listed in FIG. 6 are optional in accordance with certain embodiments. The numbering of the actions presented is for the sake of clarity and is not intended to prescribe an order of operations in which the various actions must occur. Additionally, operations from the various flows may be utilized in a variety of combinations.

In some embodiments, an apparatus may comprise means for performing various actions and/or operations of the methods of FIG. 6.

Figure 7:
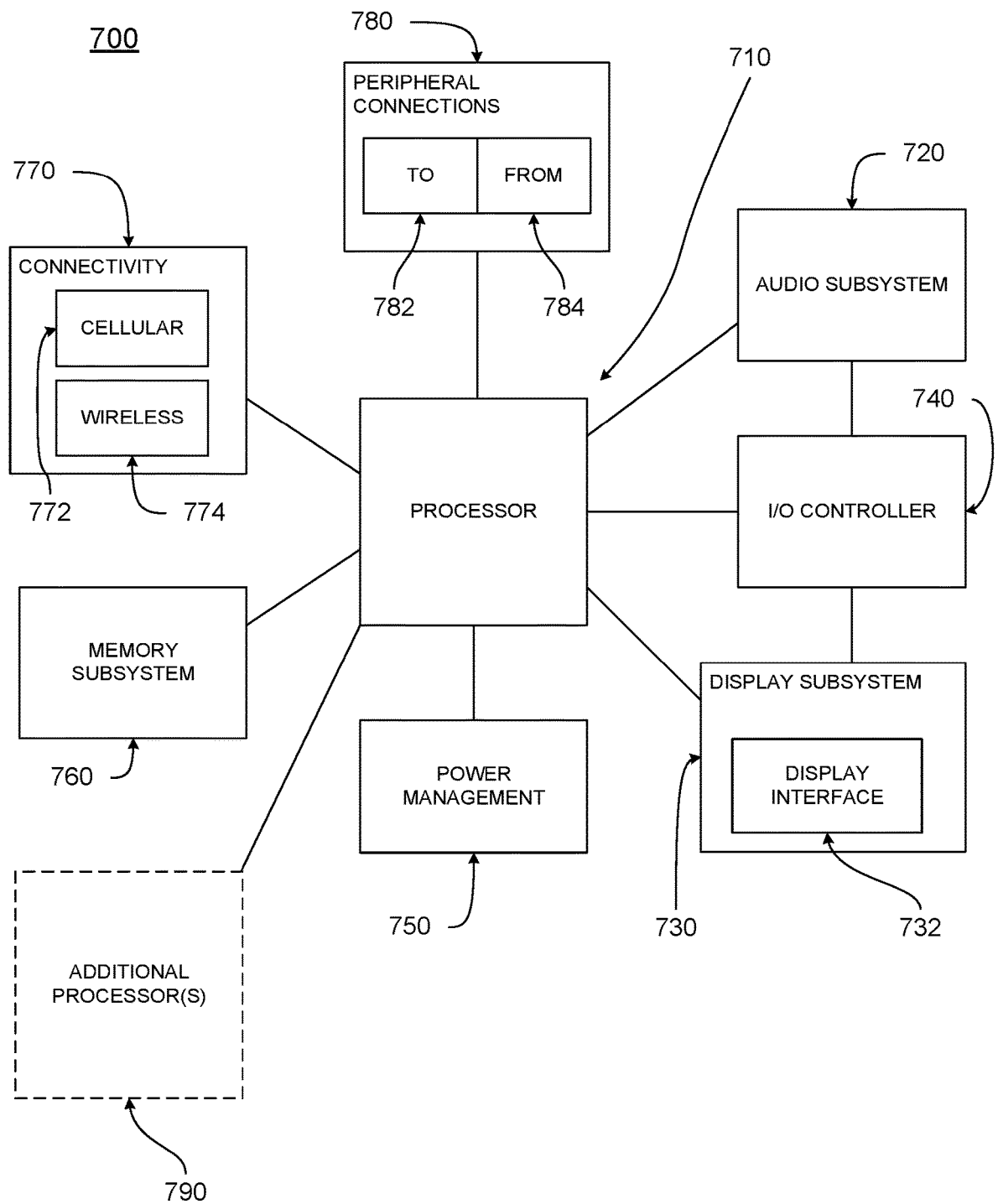
FIG. 7 illustrates a computing device with mechanisms for implementing a minimum toggle rate guarantee, in accordance with some embodiments of the disclosure.

FIG. 7 illustrates a computing device with mechanisms for implementing a minimum toggle rate guarantee, in accordance with some embodiments of the disclosure. Computing device 700 may be a computer system, a System-on-a-Chip (SoC), a tablet, a mobile device, a smart device, or a smart phone with mechanisms for implementing a minimum toggle rate guarantee, in accordance with some embodiments of the disclosure. It will be understood that certain components of computing device 700 are shown generally, and not all components of such a device are shown FIG. 7. Moreover, while some of the components may be physically separate, others may be integrated within the same physical package, or even on the same physical silicon die. Accordingly, the separation between the various components as depicted in FIG. 7 may not be physical in some cases, but may instead be a functional separation. It is also pointed out that those elements of FIG. 7 having the same names or reference numbers as the elements of any other figure can operate or function in any manner similar to that described, but are not limited to such.

In various embodiments, the components of computing device 700 may include any of a processor 710, an audio subsystem 720, a display subsystem 730, an I/O controller 740, a power management component 750, a memory subsystem 760, a connectivity component 770, one or more peripheral connections 780, and one or more additional processors 790. In some embodiments, processor 710 may include mechanisms for implementing a minimum toggle rate guarantee, in accordance with some embodiments of the disclosure. For example, one or more chip-to-chip interfaces incorporating mechanisms discussed herein for implementing a minimum toggle rate guarantee may exist between processor 710 and any of audio subsystem 720, display subsystem 730, I/O controller 740, power management component 750, memory subsystem 760, connectivity component 770, peripheral connections 780, and additional processors 790.

In various embodiments, however, any of the components of computing device 700 may include mechanisms for implementing a minimum toggle rate guarantee, in accordance with some embodiments of the disclosure. In addition, one or more components of computing device 700 may include an interconnect fabric having a plurality of ports, such as a router, a network of routers, or a Network-on-a-Chip (NoC).

In some embodiments, computing device 700 may be a mobile device which may be operable to use flat surface interface connectors. In one embodiment, computing device 700 may be a mobile computing device, such as a computing tablet, a mobile phone or smart-phone, a wireless-enabled e-reader, or other wireless mobile device. The various embodiments of the present disclosure may also comprise a network interface within 770 such as a wireless interface so that a system embodiment may be incorporated into a wireless device, for example a cell phone or personal digital assistant.

Processor 710 may be a general-purpose processor or CPU (Central Processing Unit). In some embodiments, processor 710 may include one or more physical devices, such as microprocessors, application processors, microcontrollers, programmable logic devices, or other processing means. The processing operations performed by processor 710 may include the execution of an operating platform or operating system on which applications and/or device functions may then be executed. The processing operations may also include operations related to one or more of the following: audio I/O; display I/O; power management; connecting computing device 700 to another device; and/or I/O (input/output) with a human user or with other devices.

Audio subsystem 720 may include hardware components (e.g., audio hardware and audio circuits) and software components (e.g., drivers and/or codecs) associated with providing audio functions to computing device 700. Audio functions can include speaker and/or headphone output as well as microphone input. Devices for such functions can be integrated into computing device 700, or connected to computing device 700. In one embodiment, a user interacts with computing device 700 by providing audio commands that are received and processed by processor 710.

Display subsystem 730 may include hardware components (e.g., display devices) and software components (e.g., drivers) that provide a visual and/or tactile display for a user to interact with computing device 700. Display subsystem 730 may include a display interface 732, which may be a particular screen or hardware device used to provide a display to a user. In one embodiment, display interface 732 includes logic separate from processor 710 to perform at least some processing related to the display. In some embodiments, display subsystem 730 includes a touch screen (or touch pad) device that provides both output and input to a user.

I/O controller 740 may include hardware devices and software components related to interaction with a user. I/O controller 740 may be operable to manage hardware that is part of audio subsystem 720 and/or display subsystem 730. Additionally, I/O controller 740 may be a connection point for additional devices that connect to computing device 700, through which a user might interact with the system. For example, devices that can be attached to computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of computing device 700. Additionally, audio output can be provided instead of, or in addition to, display output. In another example, if display subsystem 730 includes a touch screen, the display device may also act as an input device, which can be at least partially managed by I/O controller 740. There can also be additional buttons or switches on computing device 700 to provide I/O functions managed by I/O controller 740.

In some embodiments, I/O controller 740 manages devices such as accelerometers, cameras, light sensors or other environmental sensors, or other hardware that can be included in computing device 700. The input can be part of direct user interaction, and may provide environmental input to the system to influence its operations (such as filtering for noise, adjusting displays for brightness detection, applying a flash for a camera, or other features).

Power management component 750 may include hardware components (e.g., power management devices and/or circuitry) and software components (e.g., drivers and/or firmware) associated with managing battery power usage, battery charging, and features related to power saving operation.

Memory subsystem 760 may include one or more memory devices for storing information in computing device 700. Memory subsystem 760 can include nonvolatile memory devices (whose state does not change if power to the memory device is interrupted) and/or volatile memory devices (whose state is indeterminate if power to the memory device is interrupted). Memory subsystem 760 can store application data, user data, music, photos, documents, or other data, as well as system data (whether long-term or temporary) related to the execution of the applications and functions of computing device 700.

Some portion of memory subsystem 760 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 770 may include a network interface, such as a cellular interface 772 or a wireless interface 774 (so that an embodiment of computing device 700 may be incorporated into a wireless device such as a cellular phone or a personal digital assistant). In some embodiments, connectivity component 770 includes hardware devices (e.g., wireless and/or wired connectors and communication hardware) and software components (e.g., drivers and/or protocol stacks) to enable computing device 700 to communicate with external devices. Computing device 700 could include separate devices, such as other computing devices, wireless access points or base stations, as well as peripherals such as headsets, printers, or other devices.

In some embodiments, connectivity component 770 can include multiple different types of network interfaces, such as one or more wireless interfaces for allowing processor 710 to communicate with another device. To generalize, computing device 700 is illustrated with cellular interface 772 and wireless interface 774. Cellular interface 772 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 774 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 780 may include hardware interfaces and connectors, as well as software components (e.g., drivers and/or protocol stacks) to make peripheral connections. It will be understood that computing device 700 could both be a peripheral device to other computing devices (via "to" 782), as well as have peripheral devices connected to it (via "from" 784). The computing device 700 may have a "docking" connector to connect to other computing devices for purposes such as managing content on computing device 700 (e.g., downloading and/or uploading, changing, synchronizing). Additionally, a docking connector can allow computing device 700 to connect to certain peripherals that allow computing device 700 to control content output, for example, to audiovisual or other systems.

In addition to a proprietary docking connector or other proprietary connection hardware, computing device 700 can make peripheral connections 780 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 provides an apparatus comprising: a first circuitry to calculate a value for an internal bus inversion signal based on values of a plurality of internal signals; a second circuitry to determine a value for a bus inversion signal of an external interface based on the value of the internal bus inversion signal and a stochastic toggling component; and a third circuitry to set the values of a plurality of IO signals of the external interface based on the values of the plurality of internal signals and the value of the bus inversion signal of the external interface.

In example 2, the apparatus of example 1, wherein the third circuitry is to set the values of a plurality of IO signals of the external interface to inverted values of the plurality of internal signals when the bus inversion signal of the external interface has a first value; and wherein the third circuitry is to set the values of the plurality of IO signals of the external interface to the values of the plurality of internal signals when the bus inversion signal of the external interface has a second value.

In example 3, the apparatus of any of examples 1 through 2, wherein the stochastic toggling component is based at least upon an output of a PRNG circuitry.

In example 4, the apparatus of any of examples 1 through 3, wherein the second circuitry determines the value for the bus inversion signal of the external interface based additionally upon an output of a counter circuitry.

In example 5, the apparatus of any of examples 1 through 4, wherein the stochastic toggling component is generated to satisfy a predetermined minimum toggling rate for at least one of the plurality of IO signals of the external interface.

In example 6, the apparatus of any of examples 1 through 5, wherein the internal bus inversion signal is determined to reduce an SSO property of the plurality of IO signals of the external interface.

In example 7, the apparatus of any of examples 1 through 6, wherein the internal bus inversion signal is determined to reduce an SSN property of the plurality of IO signals of the external interface.

In example 8, the apparatus of any of examples 1 through 7, wherein the external interface is a chip-to-chip communication interface.

In example 9, the apparatus of any of examples 1 through 8, wherein the plurality of IO signals of the external interface are clocked at a frequency of at least 1 GHz.

In example 10, the apparatus of any of examples 1 through 9, wherein the plurality of IO signals of the external interface comprises at least one of a data signal, and an address signal.

Example 11 provides an apparatus comprising: a first circuitry to calculate a sequence of values for an internal bus inversion signal based upon a sequence of values for a plurality of internal signals; a second circuitry to establish a sequence of values for an external bus inversion signal by selecting between the sequence of values for the internal bus inversion signal and a sequence of substantially random values; and a third circuitry to set the values for a plurality of external IO signals to inverted values of the plurality of internal signals when respectively corresponding sequence of values for the external bus inversion signal have a first value, and to values of the plurality of internal signals when respectively corresponding sequence of values for the external bus inversion signal have a second value.

In example 12, the apparatus of example 11, wherein the sequence of substantially random values is based at least upon a sequence of pseudo-random values generated by a PRNG circuitry.

In example 13, the apparatus of any of examples 12 through 12, wherein the second circuitry selects the sequence of values for the internal bus inversion signal when a counter circuitry does not match a predetermined count value, and selects the sequence of substantially random values when the counter circuitry matches the predetermined count value.

In example 14, the apparatus of any of examples 12 through 13, wherein the external interface is a chip-to-chip communication interface.

In example 15, the apparatus of any of examples 12 through 14, wherein the sequence of substantially random values is to satisfy a predetermined minimum toggling rate for at least one of the plurality of IO signals of the external interface.

In example 16, the apparatus of any of examples 12 through 15, wherein the internal bus inversion signal is determined to reduce at least one of an SSO property of the plurality of IO signals of the external interface, and an SSN property of the plurality of IO signals of the external interface.

Example 17 provides a system comprising a memory, a processor coupled to the memory, and a wireless interface for allowing the processor to communicate with another device, the processor including: a first circuitry to calculate a value for an internal bus inversion signal based on values of a plurality of internal signals; a second circuitry to determine a value for a bus inversion signal of an external interface based on the value of the internal bus inversion signal and a stochastic toggling component; and a third circuitry to set the values of a plurality of IO signals of the external interface to inverted values of the plurality of internal signals when the bus inversion signal of the external interface has a first value, and to the values of the plurality of internal signals when the bus inversion signal of the external interface has a second value.

In example 18, the system of example 17, wherein the second circuitry determines the value for the bus inversion signal based additionally upon an output of a counter circuitry.

In example 19, the system of any of examples 17 through 18, wherein the plurality of IO signals of the external interface are clocked at a frequency of at least 1 GHz.

In example 20, the system of any of examples 17 through 19, wherein the external interface is a memory-access interface.

Example 21 provides a method comprising: calculating a sequence of values for an internal bus inversion signal based upon a sequence of values for a plurality of internal signals; establishing a sequence of values for an external bus inversion signal by selecting between the sequence of values for the internal bus inversion signal and a sequence of substantially random values; setting the values for a plurality of external IO signals to inverted values of the plurality of internal signals when the respectively corresponding sequence of values for the external bus inversion signal have a first value; and setting the values for the plurality of external IO signals to values of the plurality of internal signals when the respectively corresponding sequence of values for the external bus inversion signal have a second value.

In example 22, the method of example 21, wherein the sequence of substantially random values is generated by a PRNG circuitry; and wherein the selection for the sequence of values is based additionally upon an output of a counter circuitry.

In example 23, the method of any of examples 21 through 22, wherein the sequence of substantially random values is to satisfy a predetermined minimum toggling rate for at least one of the plurality of IO signals of the external interface.

In example 24, the method of any of examples 21 through 23, wherein the internal bus inversion signal is determined to reduce at least one of an SSO property of the plurality of IO signals of the external interface, and an SSN property of the plurality of IO signals of the external interface.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first circuitry to calculate a value for an internal bus inversion signal based on values of a plurality of internal signals;
a second circuitry to determine a value for a bus inversion signal of an external interface based on the value of the internal bus inversion signal and a stochastic toggle component, wherein the second circuitry determines the value of the internal bus inversion signal when a counter circuitry does not match a predetermined count value; and
a third circuitry to set the values of a plurality of Input/Output IO signals of the external interface based on the values of the plurality of internal signals and the value of the bus inversion signal of the external interface.

2. The apparatus of claim 1,
wherein the third circuitry is to set the values of a plurality of IO signals of the external interface to inverted values of the plurality of internal signals when the bus inversion signal of the external interface has a first value; and
wherein the third circuitry is to set the values of the plurality of IO signals of the external interface to the values of the plurality of internal signals when the bus inversion signal of the external interface has a second value.

3. The apparatus of claim 1,
wherein the stochastic toggle component is based at least upon an output of a Pseudo-Random Number Generator (PRNG) circuitry.

4. The apparatus of claim 1,
wherein the second circuitry determines the value for the bus inversion signal of the external interface based additionally upon an output of the counter circuitry.

5. The apparatus of claim 1,
wherein the stochastic toggle component is generated to satisfy a predetermined minimum toggle rate for at least one of the plurality of TO signals of the external interface.

6. The apparatus of claim 1,
wherein the internal bus inversion signal is determined to reduce a Simultaneous Switching Outputs (SSO) property of the plurality of TO signals of the external interface.

7. The apparatus of claim 1,
wherein the internal bus inversion signal is determined to reduce a Simultaneous Switching Noise (SSN) property of the plurality of TO signals of the external interface.

8. The apparatus of claim 1,
wherein the external interface is a chip-to-chip communication interface.

9. The apparatus of claim 1,
wherein the plurality of TO signals of the external interface is clocked at a frequency of at least 1 GHz.

10. The apparatus of claim 1,
wherein the plurality of TO signals of the external interface comprises at least one of a data signal, and an address signal.

11. An apparatus comprising:
a first circuitry to calculate a sequence of values for an internal bus inversion signal based upon a sequence of values for a plurality of internal signals;
a second circuitry to establish a sequence of values for an external bus inversion signal by a selection between the sequence of values for the internal bus inversion signal and a sequence of substantially random values, wherein the second circuitry selects the sequence of values for the internal bus inversion signal when a counter circuitry does not match a predetermined count value; and
a third circuitry to set the values for a plurality of external Input/Output (TO) signals to inverted values of the plurality of internal signals when respectively corresponding sequence of values for the external bus inversion signal have a first value, and to values of the plurality of internal signals when respectively corresponding sequence of values for the external bus inversion signal have a second value.

12. The apparatus of claim 11,
wherein the sequence of substantially random values is based at least upon a sequence of pseudo-random values generated by a Pseudo-Random Number Generator (PRNG) circuitry.

13. The apparatus of claim 12,
wherein the second circuitry selects the sequence of substantially random values when the counter circuitry matches the predetermined count value.

14. The apparatus of claim 11,
wherein the external bus inversion signal is for a chip-to-chip communication interface.

15. The apparatus of claim 11,
wherein the sequence of substantially random values is to satisfy a predetermined minimum toggle rate for at least one of the plurality of IO signals of an external interface.

16. The apparatus of claim 11,
wherein the internal bus inversion signal is determined to reduce at least one of a Simultaneous Switching Outputs (SSO) property of the plurality of IO signals of an external interface, and a Simultaneous Switching Noise (SSN) property of the plurality of IO signals of the external interface.

17. A system comprising a memory, a processor coupled to the memory, and a wireless interface to allow the processor to communicate with another device, the processor including:
a first circuitry to calculate a value for an internal bus inversion signal based on values of a plurality of internal signals;
a second circuitry to determine a value for a bus inversion signal of an external interface based on the value of the internal bus inversion signal and a stochastic toggle component, wherein the second circuitry determines the value of the internal bus inversion signal when a counter circuitry does not match a predetermined count value; and
a third circuitry to set the values of a plurality of Input/Output (TO) signals of the external interface to inverted values of the plurality of internal signals when the bus inversion signal of the external interface has a first value, and to the values of the plurality of internal signals when the bus inversion signal of the external interface has a second value.

18. The system of claim 17,
wherein the second circuitry determines the value for the bus inversion signal based additionally upon an output of a counter circuitry.

19. The system of claim 17,
wherein the plurality of IO signals of the external interface is clocked at a frequency of at least 1 GHz.

20. The system of claim 17,
wherein the external interface is a memory-access interface.

* * * * *